US011462664B2

(12) United States Patent
Le Blevennec et al.

(10) Patent No.: US 11,462,664 B2
(45) Date of Patent: Oct. 4, 2022

(54) LIGHT EMITTING DIODE, PIXEL COMPRISING A PLURALITY OF LIGHT EMITTING DIODES AND ASSOCIATED MANUFACTURING METHODS

(71) Applicant: COMMISSARIAT À L'ÉNERGIE ATOMIQUE AT AUX ÉNERGIES ALTERNATIVES, Paris (FR)

(72) Inventors: Gilles Le Blevennec, Grenoble (FR); Badhise Ben Bakir, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 296 days.

(21) Appl. No.: 16/796,219

(22) Filed: Feb. 20, 2020

(65) Prior Publication Data

US 2020/0274036 A1    Aug. 27, 2020

(30) Foreign Application Priority Data

Feb. 22, 2019   (FR) ...................................... 1901843

(51) Int. Cl.
*H01L 33/50*       (2010.01)
*H01L 33/46*       (2010.01)
(Continued)

(52) U.S. Cl.
CPC .......... *H01L 33/502* (2013.01); *C09K 11/588* (2013.01); *C09K 11/62* (2013.01);
(Continued)

(58) Field of Classification Search
CPC ....... H01L 33/50; H01L 33/502; H01L 33/58; H01L 33/60; H01L 33/465; H01L 2933/0041
See application file for complete search history.

(56) References Cited

U.S. PATENT DOCUMENTS

2014/0319553 A1*  10/2014  Ye ........................ H05B 45/20
                                                      257/89
2017/0250318 A1*   8/2017  Cha ....................... H01L 33/504
(Continued)

FOREIGN PATENT DOCUMENTS

EP           2 750 208 A2       7/2014

OTHER PUBLICATIONS

Search Report as issued in French Patent Application No. 1901843, dated Nov. 18, 2019.
(Continued)

*Primary Examiner* — Nelson Garces
*Assistant Examiner* — Antonio B Crite
(74) *Attorney, Agent, or Firm* — Pillsbury Winthrop Shaw Pittman LLP

(57) ABSTRACT

An optoelectronic device includes a LED that is suited to the emission of a radiation and that includes an active layer, and a conversion layer that extends over the active layer of the LED and that includes a plurality of fluorophores suited to the conversion of the radiation emitted by the LED, wherein the conversion layer is confined laterally by a mirror reflecting both the radiation converted by the fluorophores and the radiation not converted by the fluorophores, and vertically between a first and a second multilayer reflective filters forming a resonant Fabry-Perot cavity that blocks the radiation not converted by the fluorophores and has a transmittance peak for the radiation converted by the fluorophores.

13 Claims, 8 Drawing Sheets

(51) Int. Cl.
    *H01L 33/58*     (2010.01)
    *C09K 11/58*     (2006.01)
    *C09K 11/62*     (2006.01)
    *C09K 11/70*     (2006.01)
    *C09K 11/88*     (2006.01)
    *H01L 27/15*     (2006.01)
    *H01L 25/075*    (2006.01)
    *H01L 33/60*     (2010.01)

(52) U.S. Cl.
    CPC ............ *C09K 11/70* (2013.01); *C09K 11/883* (2013.01); *H01L 27/15* (2013.01); *H01L 33/507* (2013.01); *H01L 33/60* (2013.01); H01L 2933/0041 (2013.01); H01L 2933/0058 (2013.01)

(56) References Cited

U.S. PATENT DOCUMENTS

2019/0069355 A1*   2/2019   Petluri .................. H05B 45/20
2021/0408107 A1*  12/2021  Kishimoto ............ H01L 27/156

OTHER PUBLICATIONS

Baets, R. G., et al., "Resonant-Cavity Light-Emitting Diodes: a review," Proc. of SPIE, vol. 4996, (2003), pp. 74-86.
Chen, G.-S., et al., "Monolithic Red/Green/Blue Micro-LEDs with HBR and DBR Structures," IEEE Photonics Technology Letters, vol. 30, No. 3, Feb. 1, 2018, pp. 262-265.

\* cited by examiner

[Figure 1]
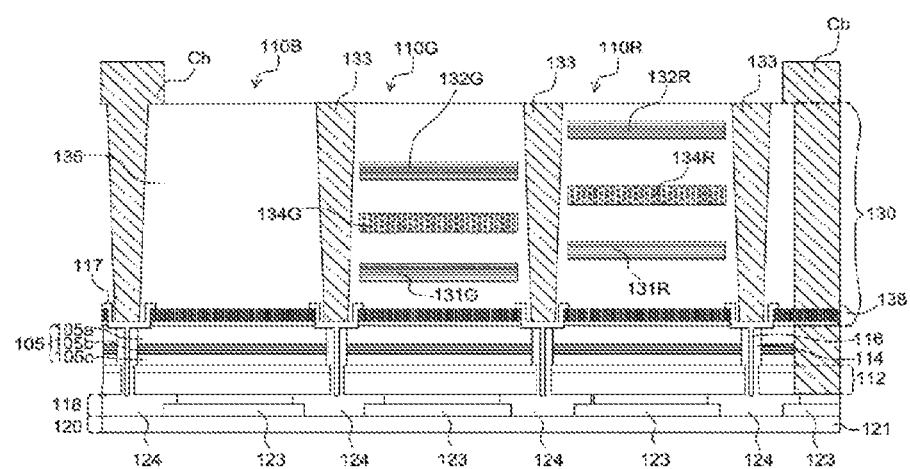

[Figure 2a]
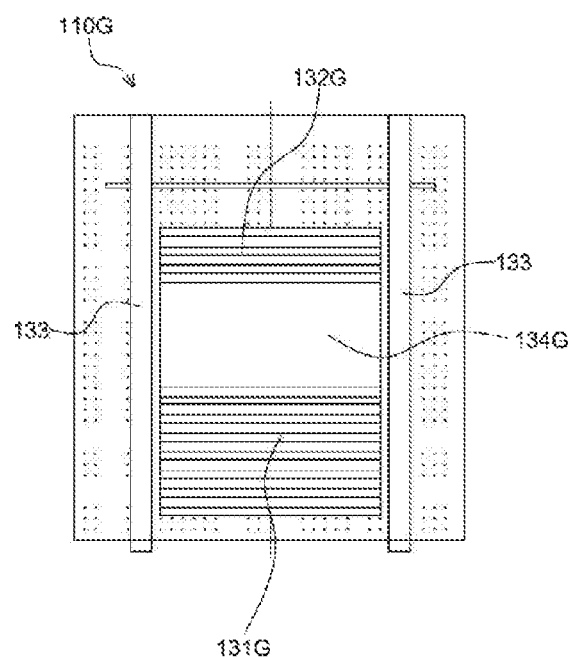
[Figure 2b]
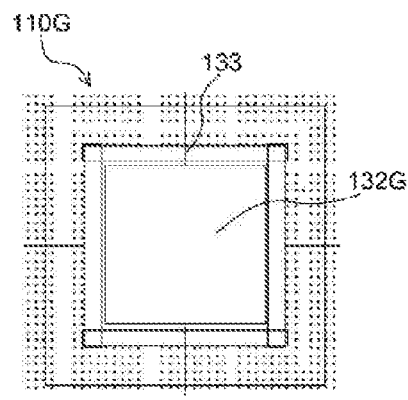

[Figure 3a]
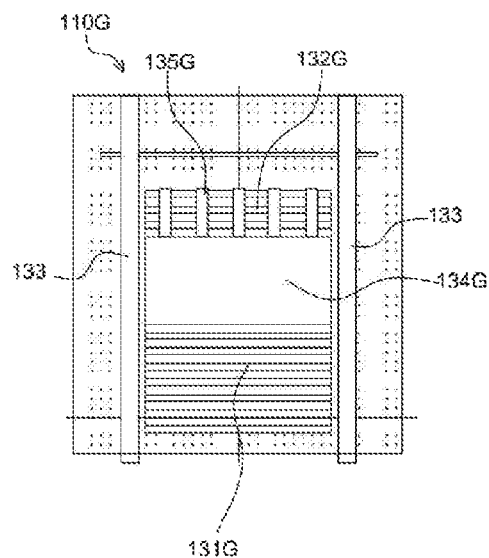
[Figure 3b]
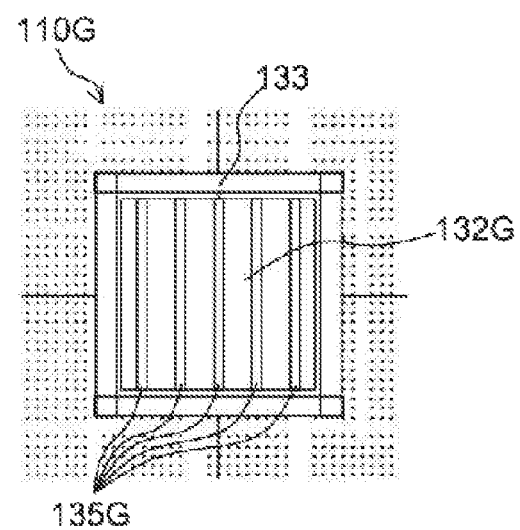

[Figure 3c]
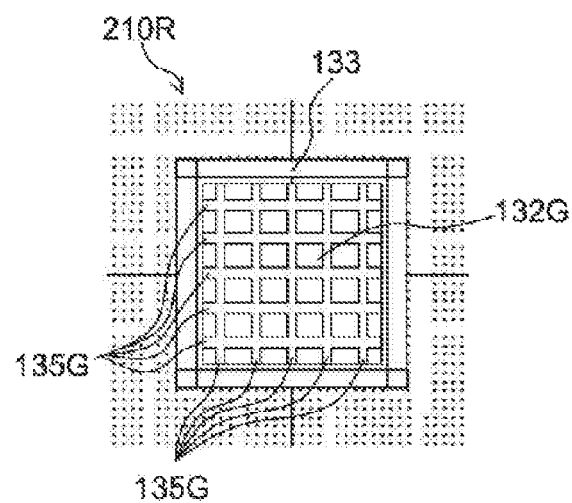
[Figure 4a]
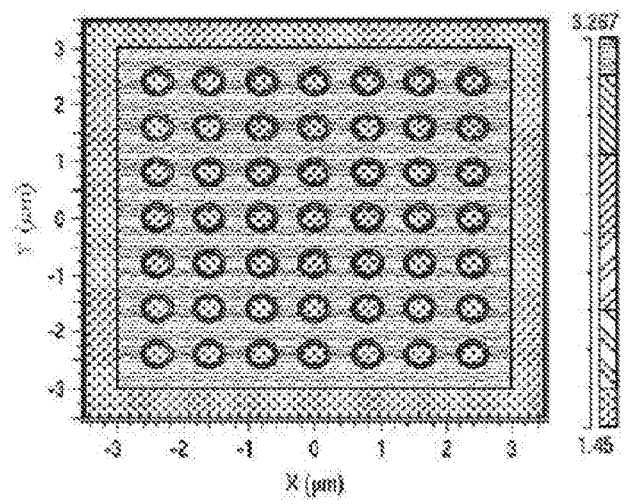

[Figure 4b]
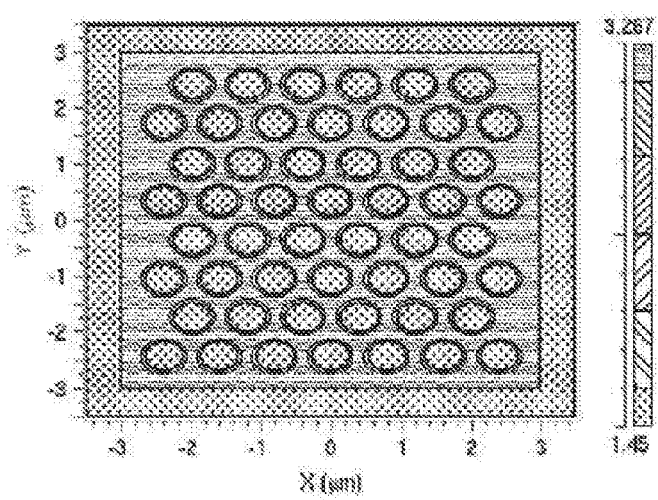
[Figure 5a]
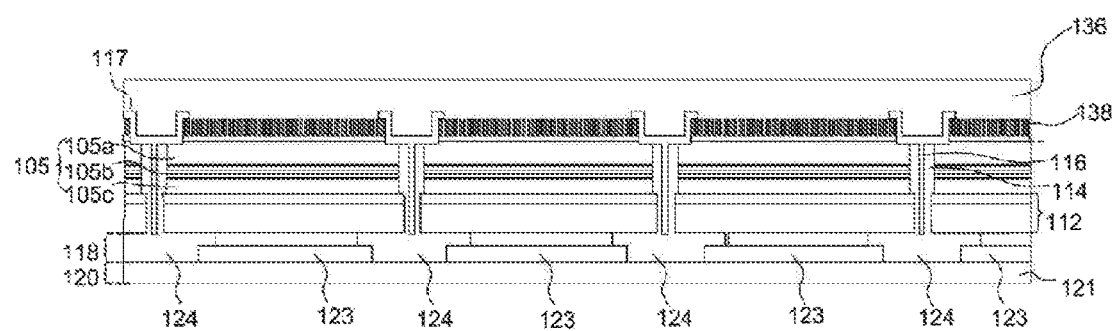

[Figure 5b]
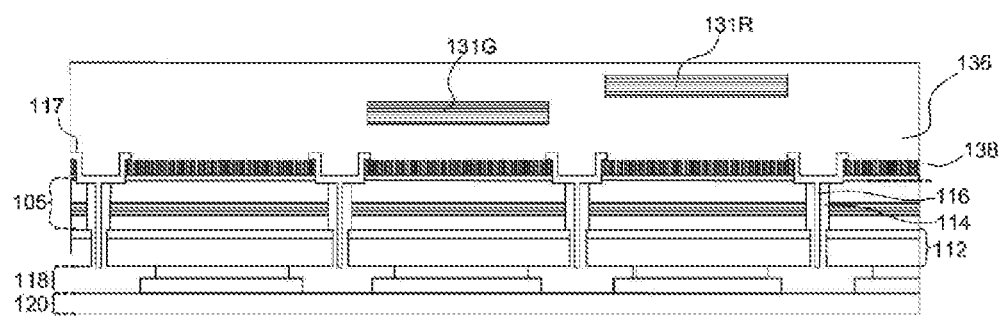
[Figure 5c]
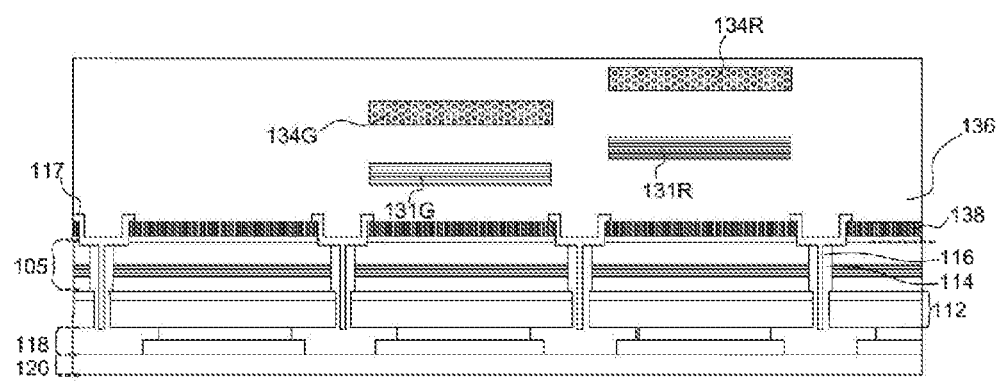

[Figure 5d]
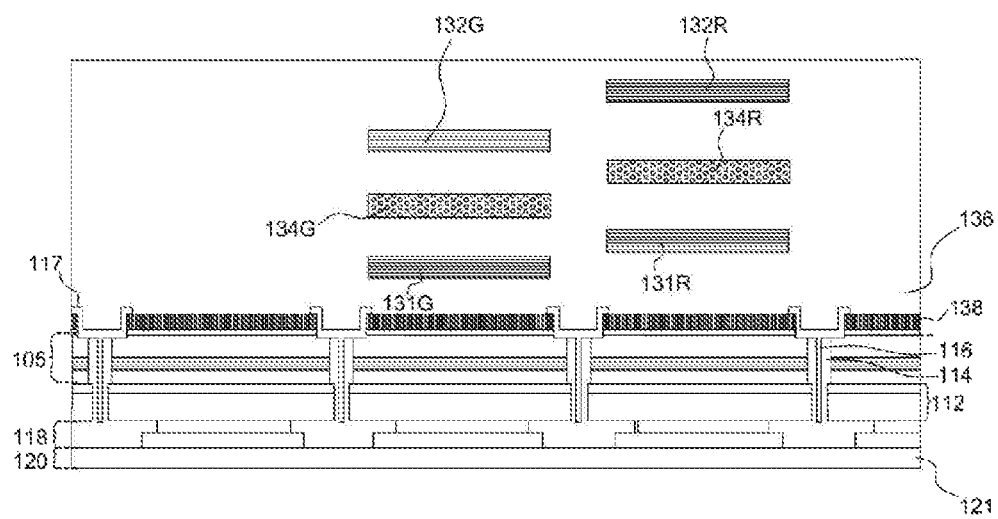
[Figure 5e]
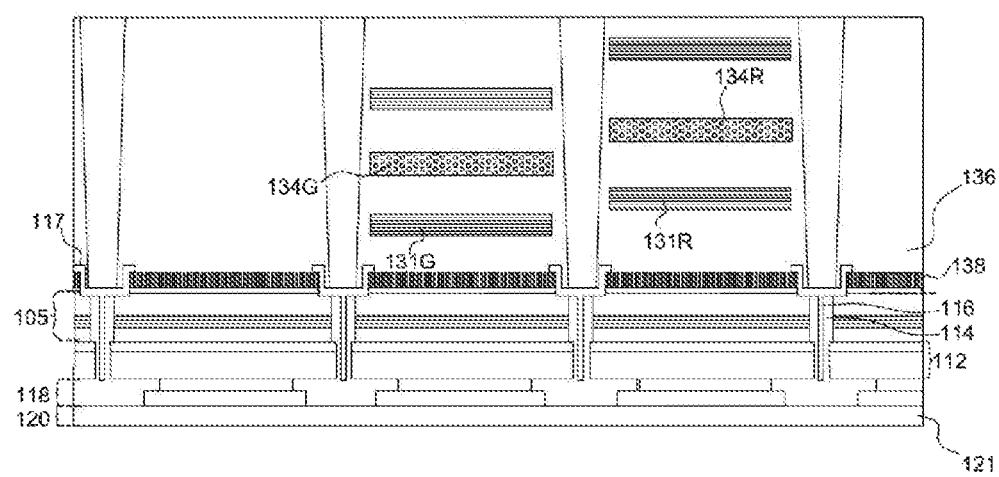

[Figure 5f]
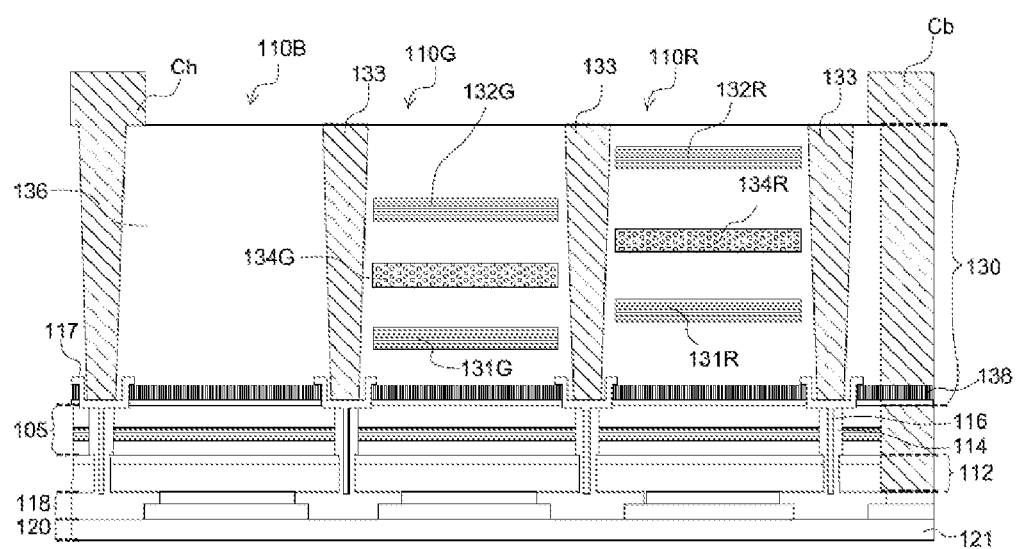

LIGHT EMITTING DIODE, PIXEL COMPRISING A PLURALITY OF LIGHT EMITTING DIODES AND ASSOCIATED MANUFACTURING METHODS

CROSS-REFERENCE TO RELATED APPLICATIONS

This application claims priority to French Patent Application No. 1901843, filed Feb. 22, 2019, the entire content of which is incorporated herein by reference in its entirety.

FIELD

The present invention relates to a light emitting diode, to a pixel comprising a plurality of light emitting diodes and to manufacturing methods thereof.

BACKGROUND

Generally speaking, a crucial parameter for display devices is to have the widest possible "gamut". In colour synthesis, whether additive or subtractive, the gamut or range of colours is the part of the set of colours that a certain type of material makes it possible to reproduce. Furthermore, lighting and display devices continually evolve by increasing the luminous fluxes and the definition of the emissive surfaces. For display screens for example, this is reflected by the passage from cathode ray tubes to liquid crystal screens and henceforth to OLED (Organic Light Emitting Diode) screens. For lighting, it involves for example the passage from incandescence light bulbs to LEDs (Light Emitting Diodes).

The use of a LED array for display or lighting purposes (for example, for headlights in the automobile industry) requires adapting the technology of semiconductor LEDs, for example made of gallium nitride GaN, to pixelized array emission. Semiconductor technology enables in fact the manufacture of arrays with pixels ranging from one micrometre to several tens of micrometres. But gallium nitride GaN, for example, only emits blue light, in the wavelength range of 460 nm.

To obtain other colours, it is necessary to carry out a conversion operation at the pixel scale. Since blue light has the highest energy of the visible spectrum, it can be converted by photoluminescence into lower energy green or red light. Photoluminescence is a process whereby a substance is excited by absorbing photons, then de-excited by remitting photons of lower energy. Photoluminescence covers two forms: fluorescence and phosphorescence. Fluorescence is rapid photoluminescence whereas phosphorescence is slow photoluminescence: it is fluorescence that is suitable for display and lighting applications. It is obtained by means of fluorophores, which may be in the form of powders associated with a polymer array.

In order to be able to be confined in pixels of a few microns, the fluorophores must be of sub-micronic dimensions. The materials currently available are 3D quantum dots of semiconductors such as cadmium selenide CdSe, indium phosphide InP or silver indium sulphide $AgInS_2$, or nanophosphores of oxide, such as YAG:Ce (yttrium aluminium garnet doped with cerium), of sulphide or of fluoride.

At the same time, to emit a saturated colour, the narrowest possible spectrum is required, for each color. A sufficiently narrow spectrum may be produced by 3D quantum dots but not by nanophosphores, which have wide band emission spectra, around 100 nm.

3D quantum dots make it possible to obtain a sufficiently narrow spectrum for each colour but they suffer from a lack of stability (several hours only) when they are subjected to a light or heat flux, which is the case in display or lighting devices. Encapsulation solutions exist, but which only enable low luminosity and low resolution.

Furthermore, a constraint of photo-conversion applied to micro-pixels is the additional thickness that it requires which, for technical reasons, notably form factor, must remain of the order of the size of the pixels: for pixels of 3 μm for example, the conversion thickness must remain of the order of 3 μm maximum; or 10 μm maximum for pixels of 10 μm. Independently of the size of the pixels, table 1 below shows the conversion thickness required to absorb blue light at 460 nm, respectively for a 3D quantum dot of indium phosphide or cadmium selenide CdSe or for a LuAG:Ce (lutetium aluminium garnet doped with cerium) nanophosphore, and for different concentrations (volume loading ratios) of fluorophore in the composite. Table 2 below shows for its part the percentage absorption reached for the different fluorophores and loading ratios of table 1.

TABLE 1

| Volume loading ratios (%) | InP | CdSe | LuAG:Ce |
| --- | --- | --- | --- |
| 10 | 8 μm | 5 μm | 150 μm |
| 20 | 3 μm | 2.5 μm | 90 μm |
| 30 | 1.2 μm | 1.2 μm | 50 μm |

TABLE 2

| Volume loading ratios (%) | InP | CdSe | LuAG:Ce |
| --- | --- | --- | --- |
| 10 | 96 | 94 | 94 |
| 20 | 98 | 96 | 95 |
| 30 | 99 | 97 | 95 |

Generally speaking, nanophosphores such as LuAG:Ce require a conversion thickness of several tens of microns to completely or almost completely absorb blue, which is not compatible with sizes of pixels less than 10 μm.

The article "Resonant-cavity light-emitting diodes: a review", of Roel G. Baets et al., Proc. of SPIE, Vol. 4996, 2003, describes the principle of a resonant cavity light emitting diode: the active layer of a gallium nitride light emitting diode is confined in a resonant Fabry-Perot cavity in order to improve the extraction efficiency.

More recently, the article "Monolithic red/green/blue micro-LEDs with HBR and DBR structures", of Guan-Syun Chen et al., IEEE Photonics Technology Letters, Vol. 30, No. 3, 1 Feb. 2018, describes a pixel comprising three gallium nitride light emitting diodes: a first without conversion layer for the emission of blue light, a second with conversion layer for the emission of red light and a third with conversion layer for the emission of green light. The fluorophores used are 3D quantum dots. The three diodes are separated from each other at the level of their active layer and at the level of their conversion layer, if need be, by a layer absorbing the luminous radiation, in order to limit crosstalk to improve the purity and the colour contrast. A lower Bragg mirror, arranged under the substrate, is configured to reflect the three colours. An upper Bragg mirror is arranged on the conversion layers of the second and third diodes in order to block blue light and further improve the purity of the extracted red and green light. The pixel obtained is of dimensions 30 µm by 30 µm.

SUMMARY

There is a need for an optoelectronic device making it possible to obtain a radiation of a colour that is saturated and different from blue, while being of micronic dimensions. There is also a need for a pixel of micronic dimensions comprising several optoelectronic devices each making it possible to obtain a radiation of a different and saturated colour, including blue.

An aspect of the invention concerns, inter alia, an optoelectronic device comprising:
- a LED suited to the emission of a radiation, the LED comprising an active layer, and
- a conversion layer extending over the active layer of the LED and comprising a plurality of fluorophores suited to the conversion of the radiation emitted by the LED, the conversion layer being confined laterally by a mirror reflecting both the radiation converted by the fluorophores and the radiation not converted by the fluorophores, and vertically between a first multilayer reflective filter and a second multilayer reflective filter forming a resonant Fabry-Perot cavity that blocks the radiation not converted by the fluorophores and has a transmittance peak for the radiation converted by the fluorophores.

The device according to the invention may also have one or more of the features below, considered individually or according to all technically possible combinations thereof:
- The fluorophores are nanophosphores;
- The nanophosphores are selected from $SrSi_2O_2N_2:Eu^{2+}$; β-SIALON; $Y_3Al_5O_{12}:Ce^{3+}$; LuAG:Ce; $LuYAlMgSiO_3:Ce$; $SrSi_5N_8:Eu^{2+}$; $(BaSr)_2Si_5N_8:Eu^{2+}$; $(Ca, Sr)AlSiN_3:Eu^{2+}$; $Sr[LiAl_3N_4]:Eu^{2+}$; $Sr[Mg_3SiN_4]:Eu^{2+}$; $Sr_{1-x}Ca_xS:Eu^{2+}$;
- The fluorophores are 3D quantum dots;
- The 3D quantum dots are selected from: ZnS; ZnSe; CdS; CdSe; CdZnSe; CdTe; PbS; InP; $CuInS_2$; $CuGaS_2$; $CuInSe_2$; $CuGaSe_2$; $CuInGaSe_2$; CuSe; InSe; GaSe or any combination of the preceding alloys;
- The radiation converted by the fluorophores is extracted from the resonant Fabry-Perot cavity by one of the first or second multilayer reflective filters, called "extraction filter", and the extraction filter comprises a grating for extracting the radiation converted by the fluorophores;
- The first multilayer reflective filter extends between the active layer and the conversion layer while the second multilayer reflective filter extends over the conversion layer, the second multilayer reflective filter having a reflectivity greater than 30% for the radiation converted by the fluorophores.

An aspect of the invention concerns also a pixel comprising a first optoelectronic device and a second optoelectronic device according to the invention, the first optoelectronic device comprising a first LED and the second optoelectronic device comprising a second LED, the radiation converted by the fluorophores of the second LED being distinct from the radiation converted by the fluorophores of the first LED.

The pixel according to the invention may also have one or more of the characteristics below, considered individually or according to all technically possible combinations thereof:
- The pixel further comprises a third LED for the emission of a radiation distinct from the radiations converted by the fluorophores of the first and second optoelectronic devices;
- The third LED has an active layer confined laterally by a mirror and vertically between a first and a second multilayer reflective filters forming a resonant Fabry-Perot cavity having a transmittance peak for the radiation emitted by the active layer;
- The radiation emitted by the active layer is extracted from the resonant Fabry-Perot cavity by one of the first or second multilayer reflective filters, called "extraction filter", and in that the extraction filter comprises a grating for extracting the radiation emitted by the active layer.

An aspect of the present invention concerns also a method for manufacturing an optoelectronic device according to the invention, comprising the following steps:
- producing a LED comprising an active layer;
- producing a first multilayer reflective filter above the active layer;
- producing a conversion layer comprising a plurality of fluorophores, configured to convert by fluorescence a radiation emitted by the active layer;
- producing a second multilayer reflective filter, in such a way that the conversion layer is confined vertically between first and second multilayer reflective filters, the first and second multilayer reflective filters forming a resonant Fabry-Perot cavity, blocking the radiation not converted by the fluorophores and having a transmittance peak for a radiation converted by the fluorophores;
- producing around the conversion layer a mirror reflecting both the radiation converted by the fluorophores and the radiation not converted by the fluorophores, so as to confine laterally the conversion layer.

An aspect of the present invention concerns also a method for manufacturing a pixel according to the invention, comprising the following steps:
- producing first and second LEDs each comprising an active layer;
- producing a first multilayer reflective filter, suited to a first radiation, above the active layer of the first LED;
- producing a first multilayer reflective filter, suited to a second radiation distinct from the first radiation, above the active layer of the second LED;
- producing a first conversion layer comprising a plurality of first fluorophores, configured to convert by fluorescence a radiation emitted by the active layer of the first LED so as to obtain the first radiation;
- producing a second conversion layer comprising a plurality of second fluorophores, configured to convert by fluorescence a radiation emitted by the active layer of the second LED so as to obtain the second radiation;
- producing a second multilayer reflective filter, suited to the first radiation, in such a way that the first conversion layer is confined vertically between the first and second multilayer reflective filters suited to the first radiation and forming a resonant Fabry-Perot cavity, blocking the radiation not converted by the first fluorophores and having a transmittance peak for the first radiation;
- producing a second multilayer reflective filter, suited to the second radiation, in such a way that the second conversion layer is confined vertically between the first and second multilayer reflective filters suited to the second radiation and forming a resonant Fabry-Perot cavity, blocking the radiation not converted by the second fluorophores and having a transmittance peak for the second radiation;
- producing, around the first and around the second conversion layers, a mirror reflecting both the first and second radiations and the radiations not converted by the first and second fluorophores, so as to confine laterally the first and second conversion layers.

BRIEF DESCRIPTION OF THE FIGURES

Other characteristics and benefits of the invention will become clear from the description that is given thereof below, for indicative purposes and in no way limiting, with reference to the appended figures, among which:

FIG. 1 schematically shows a sectional view of a pixel comprising a plurality of optoelectronic devices according to an embodiment of the invention.

FIG. 2a schematically shows a sectional view of an optoelectronic device according to a first embodiment of the invention.

FIG. 2b schematically shows a top view of the optoelectronic device of FIG. 2a.

FIG. 3a schematically shows a sectional view of an optoelectronic device according to a second embodiment of the invention.

FIG. 3b schematically shows a top view of an optoelectronic device according to a first alternative of the embodiment of FIG. 3a.

FIG. 3c schematically shows a top view of an optoelectronic device according to a second alternative of the embodiment of FIG. 3a.

FIG. 4a schematically shows a first example of the second alternative of FIG. 3c.

FIG. 4b schematically shows a second example of the second alternative of FIG. 3c.

FIG. 5a schematically shows a first step of a method for manufacturing a pixel comprising several optoelectronic devices according to the invention.

FIG. 5b schematically shows a second step of a method for manufacturing a pixel comprising several optoelectronic devices according to the invention.

FIG. 5c schematically shows a third step of a method for manufacturing a pixel comprising several optoelectronic devices according to the invention.

FIG. 5d schematically shows a fourth step of a method for manufacturing a pixel comprising several optoelectronic devices according to the invention.

FIG. 5e schematically shows a fifth step of a method for manufacturing a pixel comprising several optoelectronic devices according to the invention.

FIG. 5f schematically shows a sixth step of a method for manufacturing a pixel comprising several optoelectronic devices according to the invention.

For greater clarity, identical or similar elements are marked by identical reference signs in all of the figures.

DETAILED DESCRIPTION

Within the scope of the present document, the terms "light emitting diode", and "LED" are employed indiscriminately.

FIG. 1 schematically shows a sectional view of a pixel, comprising:
- first and second optoelectronic devices 110G, 110R according to a first embodiment of the invention, the first optoelectronic device 110G comprising a first LED and the second optoelectronic device 110R comprising a second LED; and
- a third LED 110B.

Each of the first, second and third LEDs generally comprise an active stack 105, arranged on an interconnection stack 118, itself arranged on an integrated control circuit 120. The first and second optoelectronic devices 110G, 110R according to the first embodiment of the invention further comprise a conversion stack 130 arranged on the active stack, or heterostructure, 105.

The active stack 105 comprises for example, in this order: a layer 105a of N type doped gallium nitride, an emissive layer 105b, a layer 105c of P type doped gallium nitride and an anode contact metal layer 112. The emissive layer 105b is for example constituted by a stack of one or more emissive layers each forming a quantum well, for example based on GaN, InP, InGaN, AlGaN, AlN, AlInGaN, GaP, AlGaP or AlInGaP, and each being arranged between two barrier layers, for example based on GaN. The active stack 105 is suited, when a current is applied between its anode region, formed by the layer 105c, and its cathode region, formed by the layer 105a, to emit light in a determined range of wavelengths, for example of full width at half maximum less than 100 nm, as a function of the nature of the emissive layer 105b. The stack 105 is typically suited to emit blue light. Indeed, the invention finds a particularly beneficial application in the conversion of blue light. But, generally speaking, the stack 105 is suited to emit visible light, that is to say of wavelength typically comprised between 380 nm and 700 nm, for example blue light. The stack 105 is thus generally produced based on III-V semiconductor materials, that is to say comprising an element of column V of the periodic table of elements, for example nitrogen N or phosphorous P, associated with one or more elements of column III of the periodic table of elements, for example gallium Ga, aluminium Al and/or indium In. Examples of III-V semiconductor materials are thus gallium nitride GaN, indium nitride InN, aluminium nitride AlN, gallium phosphide GaP, indium phosphide InP, indium gallium nitride InGaN, aluminium gallium nitride AlGaN, indium gallium nitride InGaN, aluminium gallium phosphide AlGaP, aluminium indium gallium phosphide AlInGaP, indium gallium aluminium nitride InGaAlN.

An example of LED architecture will now be described. In this example, substantially vertically trenches are formed in the stack 105, from the layer 112, to delimit a plurality of islands or mesas corresponding to the different LEDs of the pixel. In the example represented, these trenches extend completely through the layers 112, 105c, 105b and 105a of the stack. The side walls of the trenches are coated with an insulator layer 114 and the trenches are filled with a metal 116 having a mirror function. A contact pick-up element 117 is produced on contact of the metal 116 of each trench.

The interconnection stack 118 typically comprises one or more insulator layers, one or more metal layers, and one or more levels of conductive vias. In the example represented, the interconnection stack 118 comprises, for each LED, a metal plate for connection to an external device, connected in an individual manner to the anode electrode 112 of the LED so as to be able to command individually the current circulating in the LED and/or a voltage applied to the terminals of the LED by means of an external device.

The integrated control circuit 120 is typically formed in and on a semiconductor substrate 121, for example a silicon substrate. In the example represented, the control circuit 120 comprises on one of its faces, for each LED, a metal connection pad 123 intended to be connected to the anode electrode 112 of the LED so as to be able to command a current circulating in the LED and/or a voltage applied to the LED. The control circuit 120 comprises for example, for each LED, an elementary control cell (not detailed), connected to the metal pad 123 dedicated to the LED and comprising one or more transistors, making it possible to control the current circulating in the LED and/or the voltage applied to the LED. The control circuit 120 is for example produced using CMOS technology. The metal pads 123 may be surrounded laterally by an insulator material 124, for example silicon oxide, such that the control circuit 120 has a surface, in contact with the interconnection stack 118, which is substantially flat and comprises an alternation of metal regions 123 and insulator regions 124.

The example of LED architecture that has been described is not limiting and, generally speaking, any type of LED architecture and notably any contacting system may be envisaged. The case of a pixel comprising first and second optoelectronic devices according to the invention, as well as a third LED, have been described, however each of the first and second optoelectronic devices may be considered individually, as such.

Generally speaking, the conversion stack 130 of each optoelectronic device comprises a textured layer 138, for example made of etched semiconductor, the layer 138 being deposited on the LED architecture and making it possible to improve the extraction of the photons emitted by the stack 105. For the first optoelectronic device 110G, the conversion stack 130 comprises a first conversion layer 134G, which comprises a plurality of first fluorophores making it possible to convert by fluorescence a radiation emitted by the active layer 105 of the first LED into a first distinct radiation. Generally speaking, the radiation emitted by the active layer 105 is also called "pump radiation"; similarly, the wavelength of the radiation emitted by the active layer 105 is also called "pump wavelength". The first conversion layer 134G is confined vertically between first and second multilayer reflective filters 131G, 132G suited to the first radiation. The first and second multilayer reflective filters 131G, 132G form a first resonant Fabry-Perot cavity that blocks a radiation not converted by the first fluorophores and has instead a transmittance peak for the first radiation. The first radiation is extracted from the first cavity by one of the first or second multilayer reflective filters 131G, 132G, more precisely by the multilayer reflective filter the furthest away from the active layer 105, in this case the second multilayer reflective filter 132G, also called "extraction filter". The first conversion layer 134G beneficially has a minimum thickness of $\lambda_1/2n_1$, with $\lambda_1$ the wavelength of the first radiation and $n_1$ the optical index of the first conversion layer 134G, for better conversion efficiency.

In an analogous manner, for the second optoelectronic device 110R, the conversion stack 130 comprises a second conversion layer 134R, which comprises a plurality of second fluorophores making it possible to convert by fluorescence a radiation emitted by the active layer 105 of the second LED, or pump radiation, into a second distinct radiation. The second conversion layer 134R is confined vertically between first and second multilayer reflective filters 131R, 132R suited to the second radiation. The first and second multilayer reflective filters 131R, 132R form a second resonant Fabry-Perot cavity that blocks a radiation not converted by the first fluorophores and has instead a transmittance peak for the second radiation. The second radiation is extracted from the second cavity by one of the first or second multilayer reflective filters 131R, 132R, more precisely by the multilayer reflective filter the furthest away from the active layer 105, in this case the second multilayer reflective filter 132R, also called "extraction filter". The second conversion layer 134R beneficially has a minimum thickness of $\lambda_2/2n_2$, with $\lambda_2$ the wavelength of the second radiation and $n_2$ the optical index of the second conversion layer 134R, for better conversion efficiency.

According to an embodiment, not illustrated, it is also possible to provide a vertical confinement of the active stack 105 of the third LED, by means of first and second multilayer reflective filters forming a resonant Fabry-Perot cavity having a transmittance peak at the wavelength of the radiation emitted by the active stack 105. This makes it possible to improve the saturation of the radiation finally extracted from the Fabry-Perot cavity. Indeed, generally speaking, vertical confinement in a Fabry-Perot cavity enables a spectral redistribution and a spectral narrowing of the spontaneous emission, and thus an improvement in the saturation and the resolution. The full width at half maximum of the radiation finally extracted is typically of the order of 10 to 20 nm, against typically 100 nm for the initial radiation. It is the design engineering of the reflectivity of each multilayer reflective filter which precisely defines the spectral redistribution and full width at half maximum of the extracted radiation, and this engineering is carried out for each of the first and second optoelectronic devices, and if need be for the third LED.

Each of the Fabry-Perot cavities makes it possible, by the adjustment of its tuning and its quality factor, to narrow the transmittance peak to reach a saturated colour. In a known manner, the adjustment of a cavity is defined by the phase shift $d\Phi$ between two successive exiting rays:

$$d\Phi(\theta) = 2knl/(\cos\theta)$$

where n is the refractive index of the cavity; l is the thickness of the cavity; $\theta$ is the angle of refraction of the rays and $k=2\pi/\lambda$ with $\lambda$ the wavelength of the rays. The successive rays interfere constructively if their phase shift $d\Phi$ is equal to $2\pi$; and they interfere destructively if their phase shift $d\Phi$ is equal to $\pi$.

Each of the Fabry-Perot cavities may be configured more particularly to be resonant and to have a transmittance peak for the radiation converted by the fluorophores, for an average direction of propagation which is perpendicular to the plane of the optoelectronic device (plane of the different layers mentioned previously), that is to say for an angle $\theta=0$.

In this case, the distance between the first 131R, 131G and the second reflective filters 132R, 132G which constitute the mirrors of the Fabry-Perot cavity (that is to say the thickness of the layers extending between these two filters) is chosen such that the phase shift undergone by the converted radiation, for a to-and-fro in the cavity (to-and-fro path with a direction of propagation perpendicular to the mirrors), is equal to $m \times 2\pi$ radians, where m is an integer.

Anyhow, it will be noted that, in order that the Fabry-Perot cavity is resonant for the converted radiation, the distance between the first 131R, 131G and second 132R, 132G reflective filters must have a specific, well suited value (in other words, the cavity must be "tuned" with the average wavelength of this radiation).

In practice, the particular value(s) of the distance between the first and second reflective filters, which make it possible to satisfy this resonance condition, may be determined during a phase of dimensioning of the device (for example by digital simulation), while taking account of:
- the reflexion phase shift, associated to the reflection on each of the first and second reflective filters, at the average wavelength of the converted radiation, and
- the refractive index of the layer, or of the layers that extend between these two filters.

Each of the first and second multilayer reflective filters is for example a Bragg mirror, produced for example by a combination of thin dielectric layers of thickness $\lambda/4n$ and of high and low indices, for example $SiO_2/TiO_2$ or $SiO_2/Si_3N_4$. The optical indices of these materials are, at 460 nm, respectively 1.464/2.7878 and 1.464/2.0751. Alternatively, each of the first and second multilayer reflective filters is for example a non-periodic stack of layers of optimised thicknesses, making it possible to obtain a precise filter template.

Each of the first multilayer reflective filters 131G of the first optoelectronic device 110G, and 131R of the second optoelectronic device 110R, in an embodiment, has, respectively for the radiation converted by the first and second fluorophores, a reflectivity greater than or equal to 90%; in particular greater than or equal to 95%; specifically greater than or equal to 99%. Generally speaking, in the case of a Bragg mirror produced by a combination of thin dielectric layers of thickness π/4n and of high and low indices, the number of pairs of thin low index/high index dielectric layers making it possible to obtain sufficient reflectivity at the wavelength of the converted radiation is a function of the contrast of index between the two thin layers of the pair. The thickness of a thin dielectric layer is typically of the order of several tens of nm; the thickness of a low index/high index pair is typically comprised between 100 nm and 200 nm; and the thickness of a Bragg mirror comprising a stack of several pairs of thin low index/high index dielectric layers is typically of the order of the µm and in particular less than or equal to 1 µm.

Each of the first multilayer reflective filters 131G of the first optoelectronic device 110G, and 131R of the second optoelectronic device 110R, moreover beneficially has, for the radiation not converted by the first and second fluorophores—that is to say for the radiation emitted by the active layer 105 at the pump wavelength, a high transmittivity in order to have available a maximum of pump photons, emitted by the active layer 105, in the cavity. In particular, the high transmittivity is in particular greater than or equal to 90%; specifically greater than or equal to 95%; and desirably greater than or equal to 99%.

The second multilayer reflective filter 132G of the first optoelectronic device 110G has, for the radiation converted by the first fluorophores of the first conversion layer 134G, a reflectivity strictly less than that of the first multilayer reflective filter 131G of the first optoelectronic device 110G, for the radiation converted by the first fluorophores of the first conversion layer 134G. Similarly, the second multilayer reflective filter 132R of the second optoelectronic device 110R has, for the radiation converted by the second fluorophores of the second conversion layer 134R, a reflectivity strictly less than that of the first multilayer reflective filter 131R of the second optoelectronic device 110R, for the radiation converted by the second fluorophores of the second conversion layer 134G. It is said that the second multilayer reflective filters, or extraction filters, 132G of the first optoelectronic device 110G and 132R of the second optoelectronic device 110R, have "lowered" reflectivity: it is what allows them to extract respectively a part of the first and second radiations. The reflectivity of the second multilayer reflective filter 132G of the first optoelectronic device 110G for the radiation converted by the first fluorophores is in particular comprised in the interval [30%; 70%]; specifically in the interval [40%; 70%] or [30%; 60%]; desirably in the interval [40%; 60%]. Similarly, the reflectivity of the second multilayer reflective filter 132R of the second optoelectronic device 110R for the radiation converted by the second fluorophores is in particular comprised in the interval [30%; 70%]; specifically in the interval [40%; 70%] or [30%; 60%]; desirably in the interval [40%; 60%].

Each of the second multilayer reflective filters 132G of the first optoelectronic device 110G, and 132R of the second optoelectronic device 110R, moreover beneficially has, for the radiation not converted by the first and second fluorophores—that is to say for the radiation emitted by the active layer 105 at the pump wavelength, a high reflectivity in order to "recycle" the photons of pumps not yet converted by the first or second fluorophores, and thus to increase the conversion rate of the first and second conversion layers 134G, 134R. In particular, the high reflectivity is in particular greater than or equal to 90%; specifically greater than or equal to 95%; desirably greater than or equal to 99%.

Furthermore, the first and second conversion layers 134R, 134G are confined laterally by a mirror 133 reflecting both the first and second radiations in order to limit crosstalk, and the radiation not converted by the first and second fluorophores in order to improve its conversion rate. The mirror 133 is typically made of metal, for example made of gold Au, silver Ag, titanium Ti, copper Cu, aluminium Al, tungsten W or any other metal capable of reflecting visible light. For technological reasons of alignment and to avoid any plasmonic coupling, the mirror 133 is separated laterally from the first and second conversion layers 134R, 134G by an interval of a low index material, for example an oxide such as $SiO_2$ or a nitride such as $Si3N_4$, typically several tens of nm thick, for example 75 nm.

FIG. 2a schematically shows a sectional view of an optoelectronic device, for example the first optoelectronic device 110G, according to a first embodiment of the invention. FIG. 2b schematically shows a top view of the first optoelectronic device 110G of FIG. 2a.

FIG. 3a schematically shows a sectional view of an optoelectronic device, for example the first optoelectronic device 110G, according to a second embodiment of the invention where the extraction filter further comprises a grating for extracting the radiation converted by the fluorophores, in this case a grating for extracting 135G the first radiation emitted by the first fluorophores. FIG. 3b schematically shows a top view of an optoelectronic device, for example the first optoelectronic device 110G, according to a first alternative of the second embodiment, where the extraction grating comprises 2D photonic crystals with a texturing along a planar dimension. FIG. 3c schematically shows a top view of an optoelectronic device, for example the first optoelectronic device 110G, according to a second alternative of the second embodiment, where the extraction grating comprises 2D photonic crystals with a texturing along two planar dimensions. A general design rule is that the period of the extraction grating is comprised between $\lambda/2$ and $\lambda$, with $\lambda$ the wavelength to extract. The complete dimensioning engineering of the extraction grating notably depends on the thickness and the contrasts of index of the extraction grating, the wavelength to extract and the desired directivity. FIG. 4a schematically shows a top view of an optoelectronic device according to a first example of the second alternative of FIG. 3c. According to this first example, the photonic crystals have a square mesh. FIG. 4b schematically shows a top view of an optoelectronic device according to a second example of the second alternative of FIG. 3c. According to this second example, the photonic crystals have a triangular mesh. For each of the first and second examples, the texturing may be obtained by means of holes or conversely by means of pillars.

A method for manufacturing a pixel, comprising the first and second optoelectronic devices and the third LED described previously, will now be described in relation with FIGS. 5a to 5f. However, each of the first and second optoelectronic devices may be manufactured individually.

The method firstly comprises a step of producing an LED architecture such as described previously, comprising for example an active stack 105, arranged on an interconnection stack 118, itself arranged on an integrated control circuit 120. The method next comprises an optional step of producing a textured layer 138 such as described previously. The method next comprises a step of deposition, typically by conformal deposition, of a first insulator layer 136 such as SiO$_2$, either on the textured layer 138, or directly on the active stack 105. The method next comprises a step of planarization, typically by CMP (Chemical Mechanical Polishing), of the first layer 136. FIG. 5a shows the result obtained at the end of the planarization of the first layer 136.

The method next comprises a step of deposition of a multilayer, intended to form the first multilayer reflective filter 131G of the first optoelectronic device 110G, on the first layer 136; then a step of etching of the multilayer so as to define the first multilayer reflective filter 131G. The etching step typically comprises the deposition of a mask followed by a DUV (Deep UV) litho-etching. Alternatively, the etching step may be a RIE (Reactive Ion Etching). The method next comprises a step of deposition of a second insulator layer 136, followed by a step of planarization of the second layer 136, analogous to the deposition and to the planarization of the first layer 136, described in the preceding paragraph.

The method next comprises a step of deposition of a multilayer, intended to form the first multilayer reflective filter 131R of the second optoelectronic device 110R, on the second layer 136; then a step of etching of the multilayer so as to define the first multilayer reflective filter 131R, analogous to that described in the preceding paragraph. The method next comprises a step of deposition of a third insulator layer 136, followed by a step of planarization of the third layer, analogous to the deposition and to the planarization of the first layer 136, described previously. FIG. 5b shows the result obtained at the end of the planarization of the third layer 136.

The method next comprises a step of deposition of a first conversion material, intended to form the first conversion layer 134G, on the third layer 136. This deposition is for example carried out by spin coating. The method next comprises a step of etching of the first material so as to define the first conversion layer 134G. This etching step is for example carried out by IBE (Ion Beam Etching), in particular by RIE (Reactive Ion Etching). The method next comprises a step of deposition of a fourth insulator layer 136, followed by a step of planarization of the fourth layer, analogous to the deposition and to the planarization of the first layer 136, described previously.

The method next comprises a step of deposition of a second conversion material, intended to form the second conversion layer 134R, on the fourth layer 136. This deposition is for example carried out by spin coating. The method next comprises a step of etching of the second material so as to define the first conversion layer 134R. This etching step is for example carried out by IBE (Ion Beam Etching), in particular by RIE (Reactive Ion Etching). The method next comprises a step of deposition of a fifth insulator layer 136, followed by a step of planarization of the fifth layer, analogous to the deposition and to the planarization of the first layer 136, described previously. FIG. 5c shows the result obtained at the end of the planarization of the fifth layer 136.

The method next comprises a step of deposition of a multilayer, intended to form the second multilayer reflective filter 132G of the first optoelectronic device 110G, on the fifth layer 136; then a step of etching of the multilayer so as to define the second multilayer reflective filter 131G. The etching step typically comprises the deposition of a mask followed by a DUV (Deep UV) litho-etching. Alternatively, the etching step may be a RIE (Reactive Ion Etching). The method next comprises a step of deposition of a sixth insulator layer 136, followed by a step of planarization of the sixth layer 136, analogous to the deposition and to the planarization of the first layer 136, described previously.

The method next comprises a step of deposition of a multilayer, intended to form the second multilayer reflective filter 132R of the second optoelectronic device 110R, on the sixth layer 136; then a step of etching of the multilayer so as to define the second multilayer reflective filter 132R, analogous to that described in the preceding paragraph. The method next comprises a step of deposition of a seventh insulator layer 136, followed by a step of planarization of the seventh layer, analogous to the deposition and to the planarization of the first layer 136, described previously. FIG. 5d shows the result obtained at the end of the planarization of the seventh layer 136.

The method next comprises a step of opening of trenches delimiting the third LED and each of the first and second optoelectronic devices, for example by deep RIE (Reactive Ion Etching), each trench being aligned with a contact pick-up element 117. FIG. 5e shows the result obtained at the end of the step of opening of trenches.

The method next comprises a step of deposition of a metal in the trenches, for example by ECD (Electro Chemical Deposition), followed by a step of planarization, for example by CMP, in order to avoid any short-circuit. The method next comprises a step of producing contacts Ch and Cb, at the ends of the cathode and anode lines, typically by means of the deposition of a metal followed by an etching. FIG. 5f shows the result obtained at the end of the step of producing contacts Ch and Cb.

It will be appreciated that the invention is not limited to the embodiments described with reference to the figures and alternatives could be envisaged without going beyond the scope of the invention.

The invention claimed is:

1. An optoelectronic device comprising:
a LED configured to emit a radiation, the LED comprising an active layer, and
a conversion layer extending over the active layer of the LED and comprising a plurality of fluorophores configured for the conversion of the radiation emitted by the LED,
wherein the conversion layer is confined laterally by a mirror reflecting both a radiation converted by the fluorophores and the radiation not converted by the fluorophores, and vertically between a first multilayer reflective filter and a second multilayer reflective filter forming a resonant Fabry-Perot cavity that blocks the radiation not converted by the fluorophores and has a transmittance peak for the radiation converted by the fluorophores.

2. The optoelectronic device according to claim 1, wherein the radiation converted by the fluorophores is extracted from the resonant Fabry-Perot cavity by one of the first or second multilayer reflective filters, forming an extraction filter, and wherein said extraction filter comprises a grating for extracting the radiation converted by the fluorophores.

3. The optoelectronic device according to claim 1, wherein the first multilayer reflective filter extends between said active layer and said conversion layer while the second multilayer reflective filter extends over the conversion layer, and wherein the second multilayer reflective filter has a reflectivity greater than 30% for the radiation converted by the fluorophores.

4. A method for manufacturing an optoelectronic device according to claim 1, comprising:
- producing a LED comprising an active layer;
- producing a first multilayer reflective filter above the active layer;
- producing a conversion layer comprising a plurality of fluorophores, configured to convert by fluorescence a radiation emitted by the active layer;
- producing a second multilayer reflective filter, in such a way that the conversion layer is confined vertically between first and second multilayer reflective filters, the first and second multilayer reflective filters forming a resonant Fabry-Perot cavity, blocking the radiation not converted by the fluorophores and having a transmittance peak for a radiation converted by the fluorophores;
- producing around the conversion layer a mirror reflecting both the radiation converted by the fluorophores and the radiation not converted by the fluorophores, so as to confine laterally the conversion layer.

5. The optoelectronic device according to claim 1, wherein the fluorophores are nanophosphores.

6. The optoelectronic device according to claim 5, wherein the nanophosphores are selected from $SrSi_2O_2N_2$:$Eu^{2+}$; β-SIALON; $Y_3Al_5O_{12}$:$Ce^{3+}$; LuAG:Ce; LuYAlMg-SiO_3:Ce; $SrSi_5N_8$:$Eu^{2+}$; $(BaSr)_2Si_5N_8$:$Eu^{2+}$; $(Ca,Sr)AlSiN_3$:$Eu^{2+}$; $Sr[LiAl_3N_4]$:$Eu^{2+}$; $Sr[Mg_3SiN_4]$:$Eu^{2+}$; $Sr_{1-x}Ca_xS$:$Eu^{2+}$.

7. The optoelectronic device according to claim 1, wherein the fluorophores are 3D quantum dots.

8. The optoelectronic device according to claim 7, wherein the 3D quantum dots are selected from: ZnS; ZnSe; CdS; CdSe; CdZnSe; CdTe; PbS; InP; $CuInS_2$; $CuGaS_2$; $CuInSe_2$; $CuGaSe_2$; $CuInGaSe_2$; CuSe; InSe; GaSe or any combination of the preceding alloys.

9. A pixel comprising a first optoelectronic device and a second optoelectronic device according to claim 1, the first optoelectronic device comprising a first LED and the second optoelectronic device comprising a second LED, the radiation converted by the fluorophores of the second LED being distinct from the radiation converted by the fluorophores of the first LED.

10. A method for manufacturing a pixel according to claim 9, comprising:
- producing first and second LEDs each comprising an active layer;
- producing a first multilayer reflective filter, configured to a first radiation, above the active layer of the first LED;
- producing a first multilayer reflective filter, configured to a second radiation distinct from the first radiation, above the active layer of the second LED;
- producing a first conversion layer comprising a plurality of first fluorophores, configured to convert by fluorescence a radiation emitted by the active layer of the first LED so as to obtain the first radiation;
- producing a second conversion layer comprising a plurality of second fluorophores, configured to convert by fluorescence a radiation emitted by the active layer of the second LED so as to obtain the second radiation;
- producing a second multilayer reflective filter, configured to the first radiation, in such a way that the first conversion layer is confined vertically between the first and second multilayer reflective filters configured to the first radiation and forming a resonant Fabry-Perot cavity, blocking the radiation not converted by the first fluorophores and having a transmittance peak for the first radiation;
- producing a second multilayer reflective filter, suited to the second radiation, in such a way that the second conversion layer is confined vertically between the first and second multilayer reflective filters configured to the second radiation and forming a resonant Fabry-Perot cavity, blocking the radiation not converted by the second fluorophores and having a transmittance peak for the second radiation;
- producing, around the first and around the second conversion layers, a mirror reflecting both the first and second radiations and the radiations not converted by the first and second fluorophores, so as to confine laterally the first and second conversion layers.

11. The pixel according to claim 9, further comprising a third LED for the emission of a radiation distinct from the radiations converted by the fluorophores of the first and second optoelectronic devices.

12. The pixel according to claim 11, wherein the third LED has an active layer confined laterally by a mirror and vertically between a first multilayer reflective filter and a second multilayer reflective filter forming a resonant Fabry-Perot cavity having a transmittance peak for the radiation emitted by the active layer.

13. The pixel according to claim 12, wherein the radiation emitted by the active layer is extracted from the resonant Fabry-Perot cavity by one of the first or second multilayer reflective filters, forming an extraction filter, and wherein said extraction filter comprises a grating for extracting the radiation emitted by the active layer.

* * * * *